(12) United States Patent
Buzz

(10) Patent No.: US 10,331,807 B2
(45) Date of Patent: Jun. 25, 2019

(54) GENERATING A RULES DATABASE FOR MULTI CONDITION TAKEOFF IN A CONSTRUCTION PROJECT

(71) Applicant: On Center Software, Inc., The Woodlands, TX (US)

(72) Inventor: Leonard Buzz, Spring, TX (US)

(73) Assignee: ON CENTER SOFTWARE, INC., The Woodlands, TX (US)

( * ) Notice: Subject to any disclaimer, the term of this patent is extended or adjusted under 35 U.S.C. 154(b) by 0 days.

(21) Appl. No.: 15/804,199

(22) Filed: Nov. 6, 2017

(65) Prior Publication Data

US 2018/0060451 A1 Mar. 1, 2018

Related U.S. Application Data

(63) Continuation of application No. 13/777,714, filed on Feb. 26, 2013, now Pat. No. 9,811,612.

(51) Int. Cl.
| | |
|---|---|
| G06F 17/00 | (2019.01) |
| G06F 17/50 | (2006.01) |
| G06Q 10/06 | (2012.01) |
| G06F 17/24 | (2006.01) |
| G06Q 50/08 | (2012.01) |

(52) U.S. Cl.
CPC ........ G06F 17/5004 (2013.01); G06F 17/243 (2013.01); G06Q 10/06 (2013.01); G06Q 10/06313 (2013.01); G06Q 50/08 (2013.01)

(58) Field of Classification Search
None
See application file for complete search history.

(56) References Cited

U.S. PATENT DOCUMENTS

| | | | | |
|---|---|---|---|---|
| 5,189,606 A | * | 2/1993 | Burns | G06Q 10/06 705/7.12 |
| 6,038,547 A | * | 3/2000 | Casto | G06Q 10/06 705/30 |
| 6,581,040 B1 | * | 6/2003 | Wright | G06Q 10/06313 705/301 |
| 8,266,005 B2 | * | 9/2012 | Lopez | G06F 17/5004 705/1.1 |
| 8,818,924 B2 | * | 8/2014 | Wayne | G06F 17/5004 136/206 |
| 9,600,801 B2 | * | 3/2017 | Bushnell | G06Q 10/06 |
| 2002/0016725 A1 | * | 2/2002 | Eichstaedt | G05B 15/02 705/7.29 |
| 2002/0026343 A1 | * | 2/2002 | Duenke | G06Q 10/06 705/400 |
| 2004/0049739 A1 | * | 3/2004 | McArdle | G06Q 10/06 715/229 |

(Continued)

*Primary Examiner* — Gurkanwaljit Singh
(74) *Attorney, Agent, or Firm* — Snyder, Clark, Lesch & Chung, LLP

(57) ABSTRACT

A method and system for simultaneously performing takeoff of multiple building conditions in a construction project software program is disclosed. The method comprises selecting two or more building conditions and moving a pointer to a construction drawing to select an area to perform takeoff of the multiple building conditions on. Once the area has been selected, the method and system automatically creates one or more live objects on the selected area for each of the selected building conditions and simultaneously quantifies each of the selected building conditions based on the size of the selected area.

20 Claims, 9 Drawing Sheets

(56) References Cited

U.S. PATENT DOCUMENTS

| | | | |
|---|---|---|---|
| 2005/0038636 A1* | 2/2005 | Wakelam | G06F 17/5004 703/1 |
| 2008/0015823 A1* | 1/2008 | Arnold | G06F 8/20 703/1 |
| 2008/0167971 A1* | 7/2008 | Lopez | G06Q 10/087 705/26.8 |
| 2010/0217565 A1* | 8/2010 | Wayne | G06F 17/5004 703/1 |
| 2010/0217639 A1* | 8/2010 | Wayne | G06F 17/5004 705/7.23 |
| 2010/0217724 A1* | 8/2010 | Wayne | G06F 17/5004 705/348 |
| 2010/0324956 A1* | 12/2010 | Lopez | G06F 17/5004 705/7.37 |
| 2010/0332355 A1* | 12/2010 | Lopez | G06F 17/5004 705/27.1 |
| 2012/0284596 A1* | 11/2012 | Bushnell | G06Q 10/06 715/205 |
| 2014/0095122 A1* | 4/2014 | Appleman | G06T 19/003 703/1 |

\* cited by examiner

GENERATING A RULES DATABASE FOR MULTI CONDITION TAKEOFF IN A CONSTRUCTION PROJECT

CROSS-REFERENCE TO RELATED APPLICATION

The application is a continuation of U.S. patent application Ser. No. 13/777,714, filed on Feb. 26, 2013, the contents of which are hereby incorporated herein by reference in their entirety.

TECHNICAL FIELD

The present invention relates to management of construction projects, and in particular to techniques for increased efficiency of construction project software programs.

BACKGROUND

Construction professionals generally use computer software programs to provide pricing for large construction projects. Some of these construction software programs include capabilities for drawing or uploading construction plans and/or engineering drawings. The software programs may enable a user to enter a list of building conditions that are required to be completed for a given construction project. The term building condition refers to each separate component of the construction project that needs to be built or installed. For example, the ceiling, exterior structure, doors, or a particular type of wall are all considered building conditions. In order to price a project correctly, an efficient method of calculating and tracking the quantities associated with each building condition may be needed. One way of achieving that is by creating live objects on a construction drawing for each building condition. As building conditions are entered, a user can create live objects on the construction drawings, where the live objects are linked to and represent particular building conditions. This process is sometimes referred to as takeoff. Once takeoff of building conditions is complete, the resulting software file would quantify building conditions and could be used to calculate a projected cost for the entire project and thus help create a bid for it. Such a file can also be used to track and manage the project once a bid is accepted and work on the project begins.

Accordingly, takeoff of building conditions in a construction project software program assists in automating unit and cost calculations and facilitates using such a program for keeping track of change and progress in the project. However, the process of takeoff itself can be very time consuming. That is because each area of a construction project requires completion of many different building conditions. For example, a bedroom needs a ceiling, electrical wiring, light fixtures, drywall, paint, flooring, a door, windows, and more. These building conditions need to be quantified individually and the process has to be repeated for each room or area of the construction project separately. In large construction projects involving many different building areas this means quantifying building conditions hundreds if not thousands of times. This can become a very time consuming and tedious process.

Thus, it would be desirable to implement a more efficient method for performing takeoff in a construction project software program.

SUMMARY

A method and system for simultaneously performing takeoff of multiple building conditions in a construction project software program is disclosed. The method comprises selecting two or more building conditions and moving a pointer to the construction drawing to select an area of the drawing on which to perform takeoff of the multiple building conditions. Once the area has been selected, the method and system creates one or more live objects on the selected area for each of the selected building conditions and simultaneously quantifies each of the selected building conditions based on the size of the selected area. The live objects include visual markers for each of the building conditions that are linked to their corresponding building condition.

BRIEF DESCRIPTIONS OF THE DRAWINGS

DETAILED DESCRIPTIONS

Figure 1:
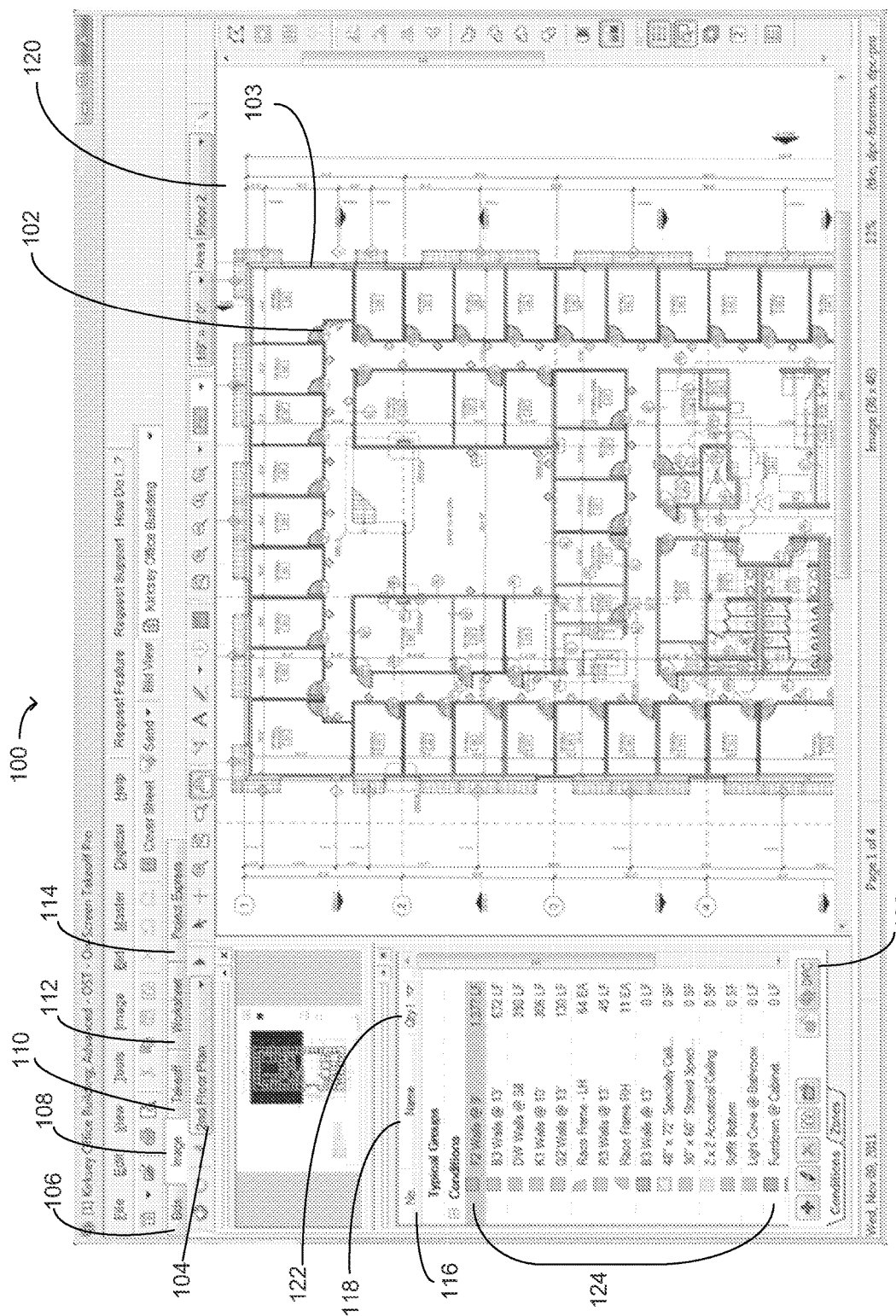
FIG. 1 is a diagram illustrating an exemplary user interface screen for a construction software program showing a construction drawing and its related information.

FIG. 1 illustrates an exemplary user interface screen 100 used in a construction project software. Generally, a first step in using this software program is to create or upload one or more engineering or construction drawings into the program. Construction drawings for each project generally include a representation for each of the various building conditions in the project.

The user interface screen 100 includes several buttons, tabs and drop down menus that provide a variety of options for viewing and processing of construction related information. For example, the screen 100 includes a tab 106 for choosing to view the Bids, a tab 108 to view the Image, a tab no for viewing quantity totals in Takeoff, a tab 112 to view an estimating Worksheet, and a tab 114 to view Project Express for sending and receiving bids. When selected, the Image tab 108 provides a view of a construction drawing, such as the construction drawing 120. A dropdown menu 104 allows the user to select which page or area of the construction project to view. The selected area can be any part of the construction project for which a separate construction drawing exists. For example, the dropdown menu 104 in screen 100 shows that the $2^{nd}$ Floor Plan has been selected. As such the corresponding drawing 120 includes all the various building conditions in the $2^{nd}$ Floor area of this construction project. Before takeoff is performed, the drawing 120 by itself is just a two dimensional drawing and does not include any objects that have underlying values. Objects are created on the drawing during the takeoff process.

The takeoff process involves counting or quantifying all building conditions for the project and is performed by estimators in construction projects to determine an estimated cost for the project. For example, for the building condition of interior doors, all required interior doors are counted. In the construction project software of the preferred embodiment, this process can be performed by selecting a building condition from the conditions list 116 and clicking on (or otherwise selecting) places and/or areas on the drawing 120 where the selected building condition is to be located. By doing so, an object that corresponds to the selected building condition is placed on the drawing. An object is generally represented by a colored line or shape, depending on the type of the building condition, and is linked to the building condition represented by the object. For building conditions that are counted by their quantity, such as doors and windows, merely clicking on a spot on the drawing creates a colored representation of that condition and adds one to the total counted quantity for that building condition. An example is the door 102 shown in the drawing 120. By selecting door as a building condition in the conditions list 116 (not shown) and clicking on a spot on the drawing where a door needs to be placed, an object 102 is created. The object 102 is a live object, meaning that it recognizes that it represents the "door" building condition on the $2^{nd}$ floor, and it increases the total quantity of the count for doors by one.

For objects, such as walls that are quantified by their length, a line is usually drawn on the drawing to create a corresponding object. An example is the wall 103 on the drawing 120. Based on the length of the line drawn, the software automatically increases the quantity being measured for the building condition associated with the object. In this manner, the takeoff process achieves two objectives. One is quantifying the building conditions in the project, and the other is creating live objects that have underlying values and are linked to corresponding building conditions.

The two dimensional image shown in the drawing 120 can also be three dimensional (3D) such as a 3D CAD drawing, Building Information Model (BIM), or the like. A 3D drawing is advantageous in that the user can view each of the various building areas in a manner that is closer to the actual shape and design of the buildings and can examine each object easier. Some 3D models also include objects that have built-in associated quantities. The quantities can include the size of the object and may also include associated labor activities and materials required to complete it.

Referring back to the user interface screen 100 of FIG. 1, the screen allows the user to click on each object in the drawing 120 to select the associated building condition. For example, the user can click on and select a particular type of wall, such as the "F2 Walls @ 9'" wall 103 selected in FIG. 1. When selected, that building condition becomes highlighted in the conditions list 116. The conditions list 116 also displays a list of names 118 for building conditions 124 and a corresponding column Qty1 122 showing the associated total quantity for each building condition. The column Qty1 122 represents the quantity associated with each building condition in the drawing 120 in an appropriate unit of measurement.

Figure 2A:
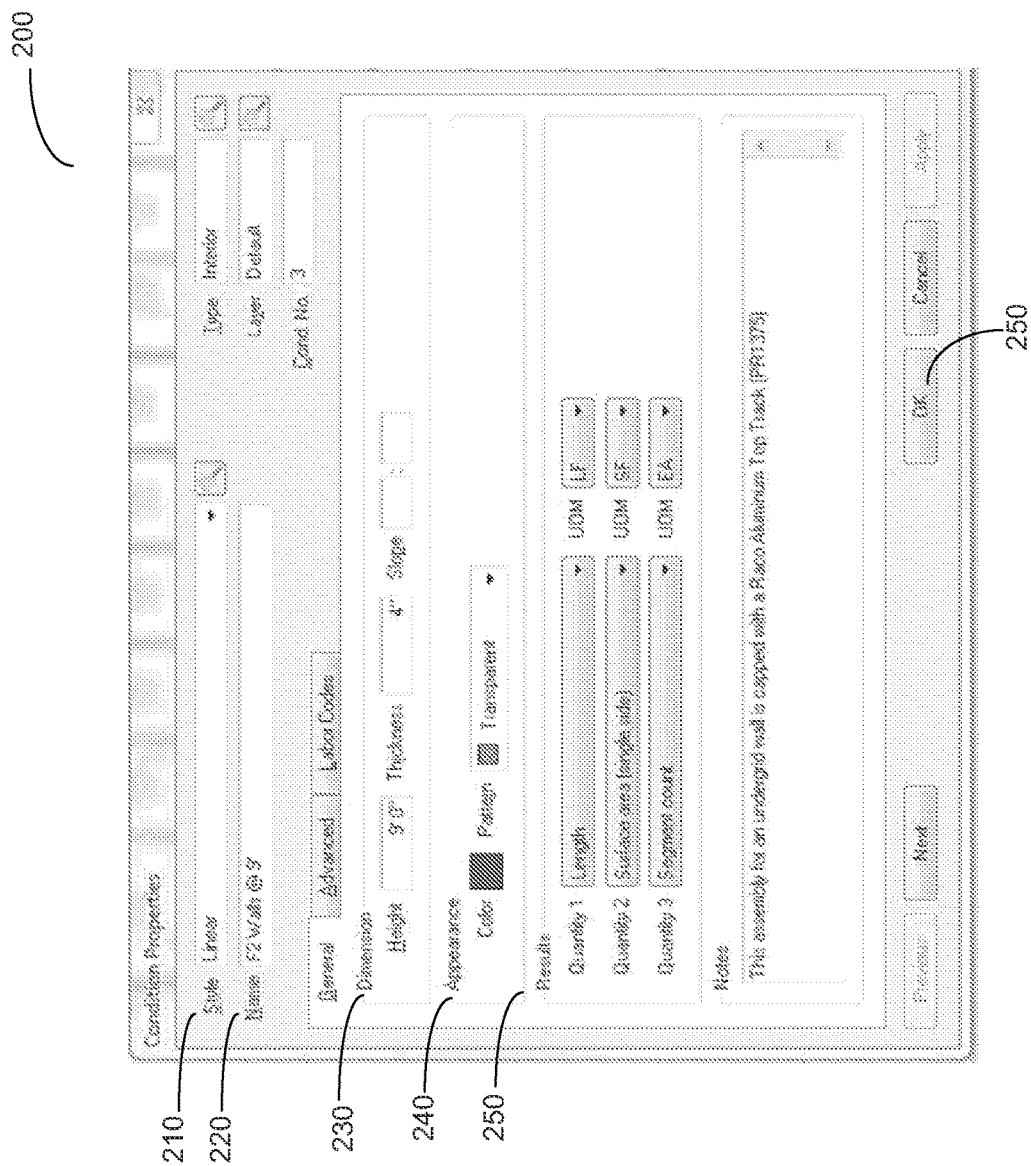
FIGS. 2A-2B are diagrams illustrating exemplary user interface screens for a construction software program showing properties for a building condition in the construction drawing.

Double clicking on or otherwise selecting a building condition in the conditions list 116 brings up a window for setting properties of that building condition. For example, double clicking on F2 Walls @ 9' in the conditions list 116, brings up the properties window 200 of FIG. 2A. The window 200 can also be presented for creating a new building condition.

The condition properties window 200 includes entries for style 210 and name 220. The style 210 enables the user to select the type of object that will be placed on the drawing when this particular building condition is selected. "Linear" is used for building conditions such as walls that are shown by lines; "each" is used for building conditions such as doors and frames, and "area" is used for building conditions such as tiles that cover an area and are represented on the drawing by coloring or shading the area that corresponds to that building condition. The name 220 allows the user to change or select a name for the building condition. Entries for dimension 230 allow the user to select height, thickness and slope for the object representing the building condition on the drawing and entries for Appearance 240 enable the user to select a color and pattern for that object. The results 250 includes three dropdown boxes to choose up to three units of measurements for quantities associated with the building condition. Linear feet is used for measuring length, while square feet is used for surface area and each is used for segment count. Other options are also presented in window 200. Once all changes have been made to the desired properties, the user is taken back to the user interface 100 of FIG. 1 by selecting the OK button 250 of FIG. 2A.

Figure 2B:
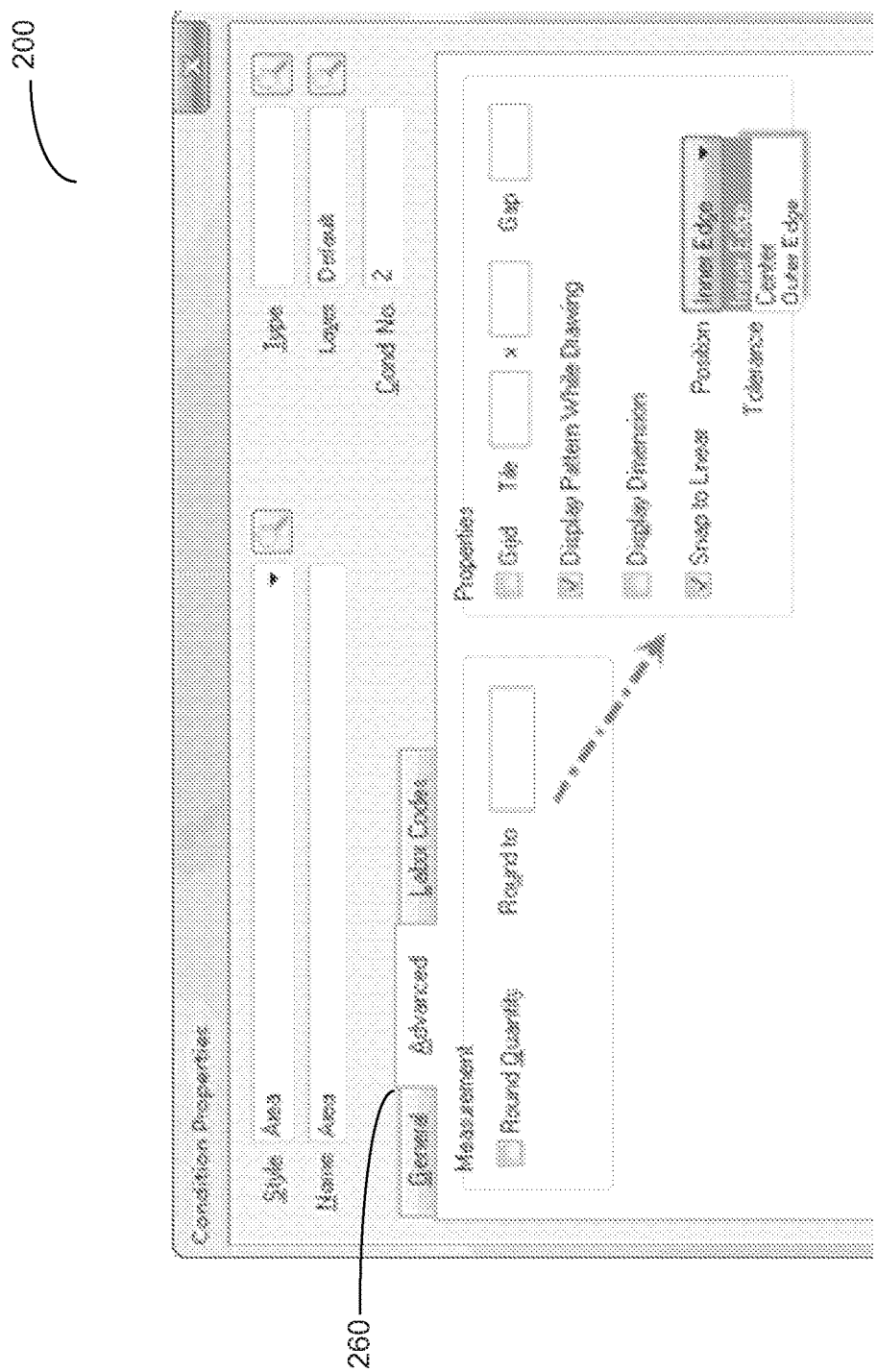
Figure 2E:
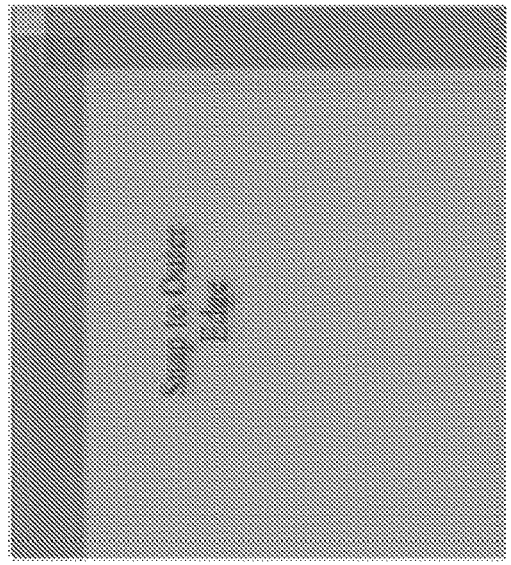
FIGS. 2C-2E are diagrams illustrating options for snapping an area condition to a linear object.
Figure 2D:
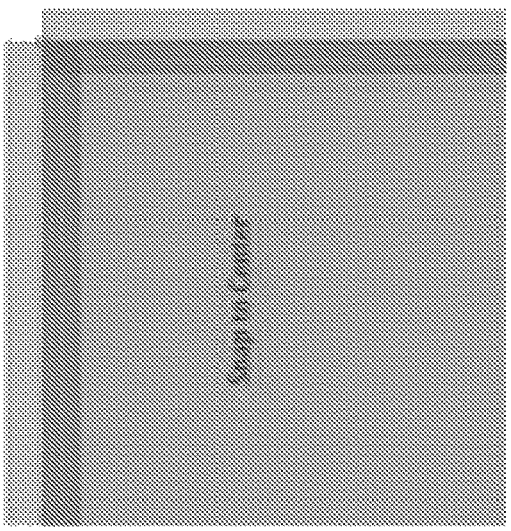

FIG. 2B illustrates a view of the conditions properties window 200 with the Advanced tab 260 selected. The advanced tab allows the user to select advanced properties for the building condition. These properties include the option to round the measurement quantity of the building condition and to choose to display the pattern while the building condition is being drawn on the drawing. The properties also include the option for area building conditions, to choose how to snap to a linear object on the drawing. For example, the user can select to snap to the inner, center or outer edge of a surrounding linear object. This is illustrated in FIGS. 2C-2E.

Figure 2C:
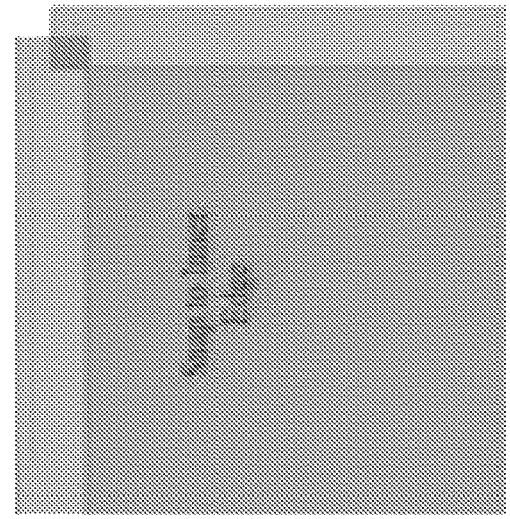

FIG. 2C shows how an area object snaps to the inner edge of a linear object, when snap to the inner edge is selected as the object. FIG. 2D illustrates how the area snaps to the center of the object and FIG. 2E shows how it snaps to the outer edge of the object. As can be seen, depending on the option selected, both the way the object linked to the building condition is shown on the drawing and the size of the area measured for the building condition during the takeoff process will be different for each of the selected options.

Figure 3:
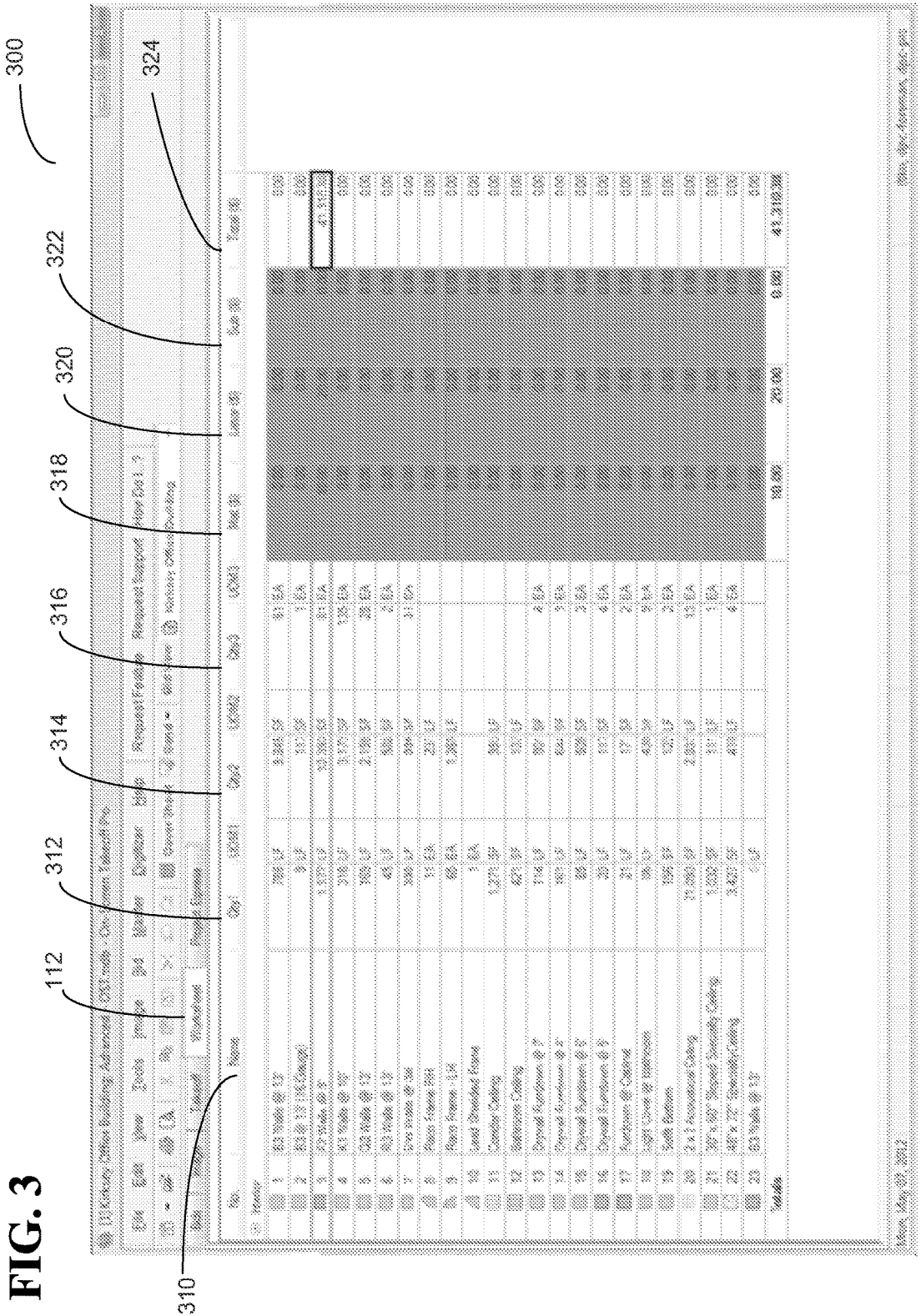
FIG. 3 is a diagram illustrating an exemplary user interface screen for the construction software program providing cost information for building conditions in the drawing.

Once all building conditions have been created and takeoff has been performed, in one embodiment, the quantity information gathered through the takeoff process is used to create a cost estimate for the project. In the preferred embodiment of the present invention, this is done by using a worksheet integrated into the construction project software represented in FIG. 1. Clicking on the Worksheet tab 112 of FIG. 1, takes the user to the estimating Worksheet screen 300 of FIG. 3.

The Worksheet screen 300 includes a column 310 that lists the name of the various building conditions and columns 312, 314 and 316 that list the associated quantities measured for each of the named building conditions. The screen 300 also includes a column 318 for listing the cost of material associated with each building condition, a column 320 for listing the cost of labor for each building condition, a column 322 which displays a subtotal for the costs associated with each building condition and a column 324 that displays the total cost for each building condition. After quantity and cost information for building conditions in a project has been entered, the software program can calculate a total estimated cost for the construction project.

In an alternative embodiment, a separate software program designed for estimating construction projects, such as Quick Bid®, provided by On Center Software™, Inc. is used to calculate the estimated costs associated with a project. When a separate estimating program is used, a file is created in the estimating program containing detailed cost information for each building condition in the construction project file presented in FIG. 1. This estimating file is linked to the file represented in the interface screen 100.

Although the information gathered and the links created through the takeoff process is very useful in increasing efficiency of the bidding process and management of construction projects, the takeoff process itself can be time consuming and burdensome in large and complex projects. That is because each area or room of a construction project requires the completion of multiple building conditions, and current construction project software programs require that live objects for each building condition be individually created and quantified for each area of the construction project. This can take a lot of time in large construction projects.

The preferred embodiment of the present invention provides a method for performing the quantity takeoff process for multiple conditions at the same time and thus significantly reduces the amount of time and effort required for takeoff. Prior art construction project software programs require takeoff to be performed one by one for each building condition, because of the complexity of creating multiple live objects and making multiple quantity measurements at the same time. The process of takeoff is complex because in addition to automatically performing quantity measurements and creating live objects, the process also creates a visual marker for representing the building condition on the construction drawing. For example, as discussed before, the wall 103 of FIG. 1 is represented by a line.

Visual properties of the visual marker can be selected in the building condition properties window (screen 200 of FIG. 2) and include color and dimensions. For a linear object such as a line those visual properties include color and thickness of the line. For an object that encompasses an area, such as ceiling, the visual properties include color, pattern and thickness of the line surrounding the area. Generally each building condition has distinct visual properties that help identify it separately on the construction drawing. Thus takeoff not only includes quantity measurement and linking of a visual marker to the building condition, it also includes creating a visual marker with distinct visual properties. Thus, for takeoff of multiple conditions at the same time, the software needs to determine how and if the various visual markers can be shown at the same time.

The present invention provides a way to integrate many different business and mathematical rules into the software to enable takeoff of multiple conditions at the same time. This is done by checking a rules database once multiple conditions that include different types of units of measurements are selected. The rules database helps determine how to display the objects on the drawing and how to measure the quantities associated with each condition. For example, the rules database provides that for building conditions that include both linear and area units of measurement, area snaps to the linear that proceeded it in the order the user selected the building conditions. An example is illustrated in FIGS. 4A-4B.

Figure 4A:
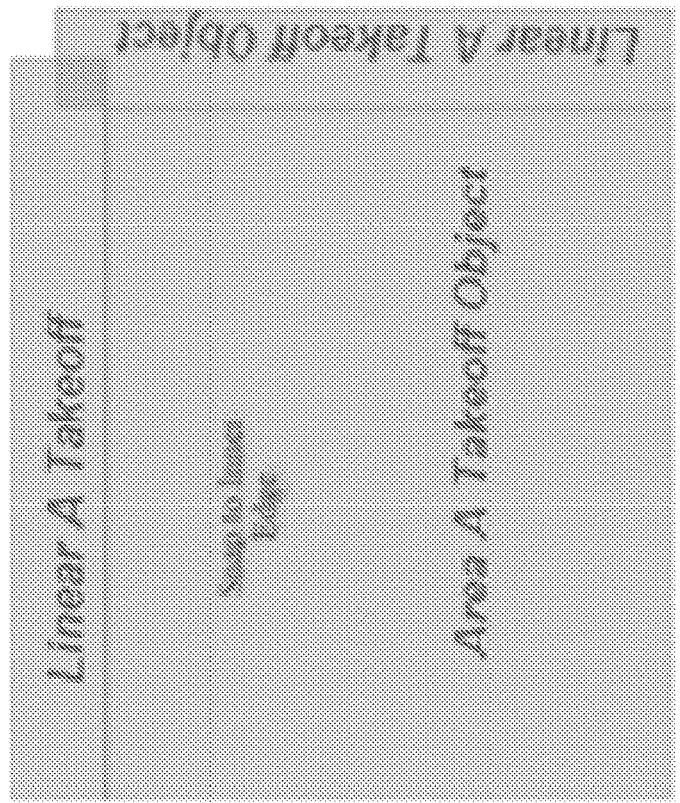
FIGS. 4A-4B are diagrams illustrating exemplary ways in which an area condition snaps to a linear object.
Figure 4B:
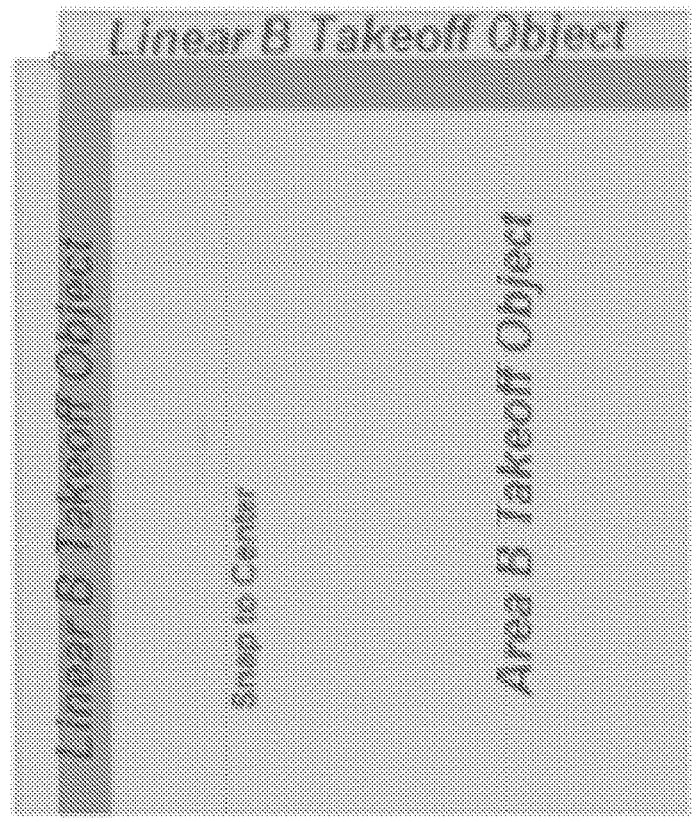

If the user selects multiple conditions in the following order: 1) building condition A with a linear unit of measurement and an area that is supposed to snap to the inner edge, and 2) building condition B that includes a linear and an area that is supposed to snap to the center, the area for the object representing building condition A would snap to the inner edge of the linear object A (as shown in FIG. 4A) and area B would snap to the center edge of the linear object B (as shown in FIG. 4B).

In an alternative embodiment, the rules database provides that all area takeoff objects that are created snap to the middle of the linear objects used in that step of the process, regardless of what option is selected in FIG. 2B for snapping to the objects.

The rules database also sets the order in which objects are drawn on the drawing. The order depends on the types of units of measurements involved for the building conditions selected. In one embodiment, when building conditions that include both linear and count types of measurement units are selected, the objects are drawn in the following order: 1) linear objects, 2) count objects. The count objects would be drawn at each point the user clicks (or otherwise indicates a selection) on the drawing with one exception. The last double click to end the takeoff process will be only counted as one click for the count object. If the user does not intend to include a count at the ending location, the user can press the space bar instead of double clicking in which case the ending location will not be counted.

When the building conditions selected include both area and count, in one embodiment, the rules provide that area is drawn first and count is drawn at each point user clicks on the drawing with the following exception. The last double click to end the takeoff process will be only counted as one click for the count object. If the user ends the process by pressing the space bar instead of double clicking, the space bar is treated as a single mouse click for the count object. When the building conditions selected include area, linear and count measurement units, in one embodiment, the rules provide that the objects would be drawn in the following order: linear, area, and then count.

Figure 5A:
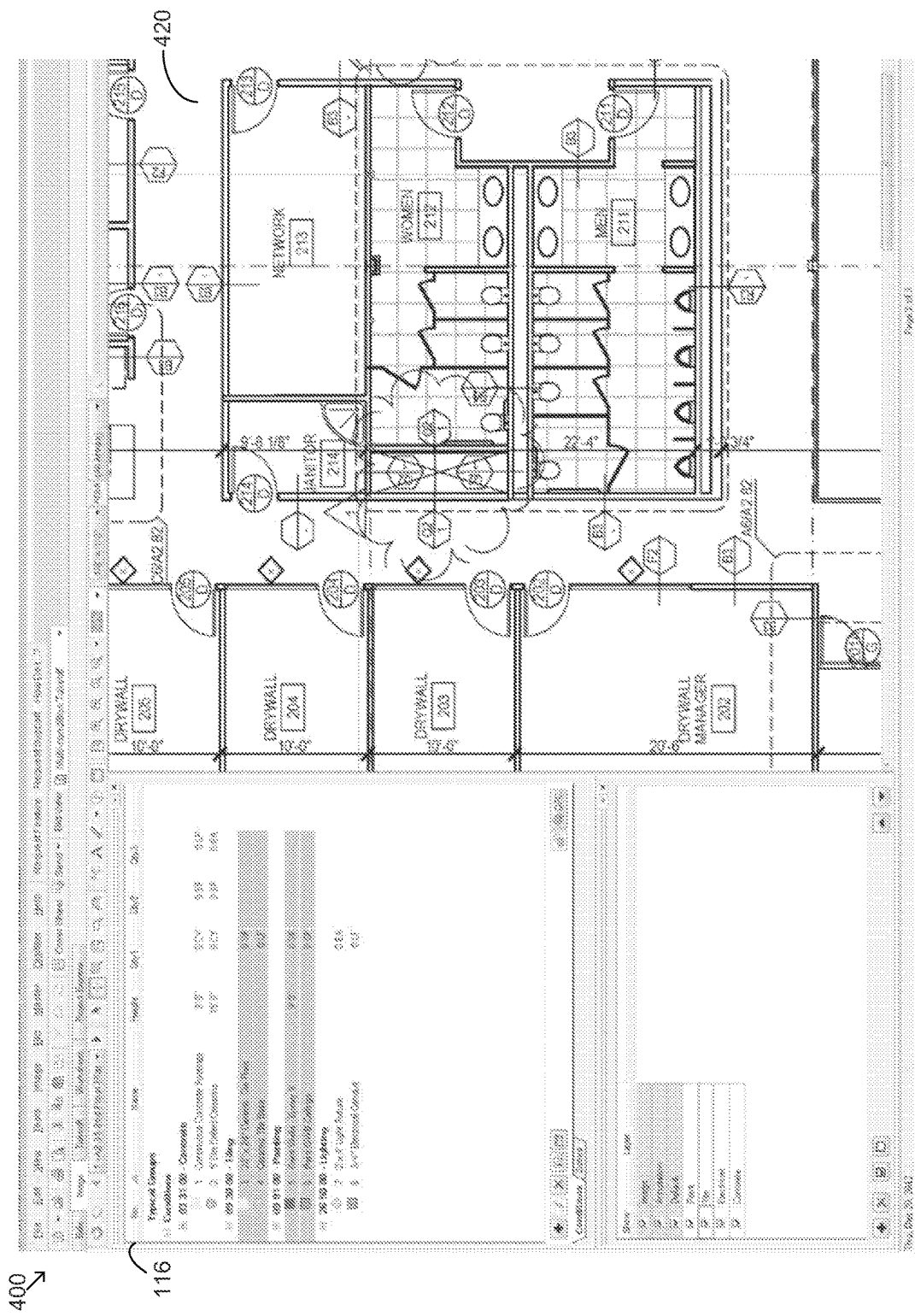
FIGS. 5A-5B are diagrams illustrating exemplary user interface screens having a multi condition takeoff capability.
Figure 5B:
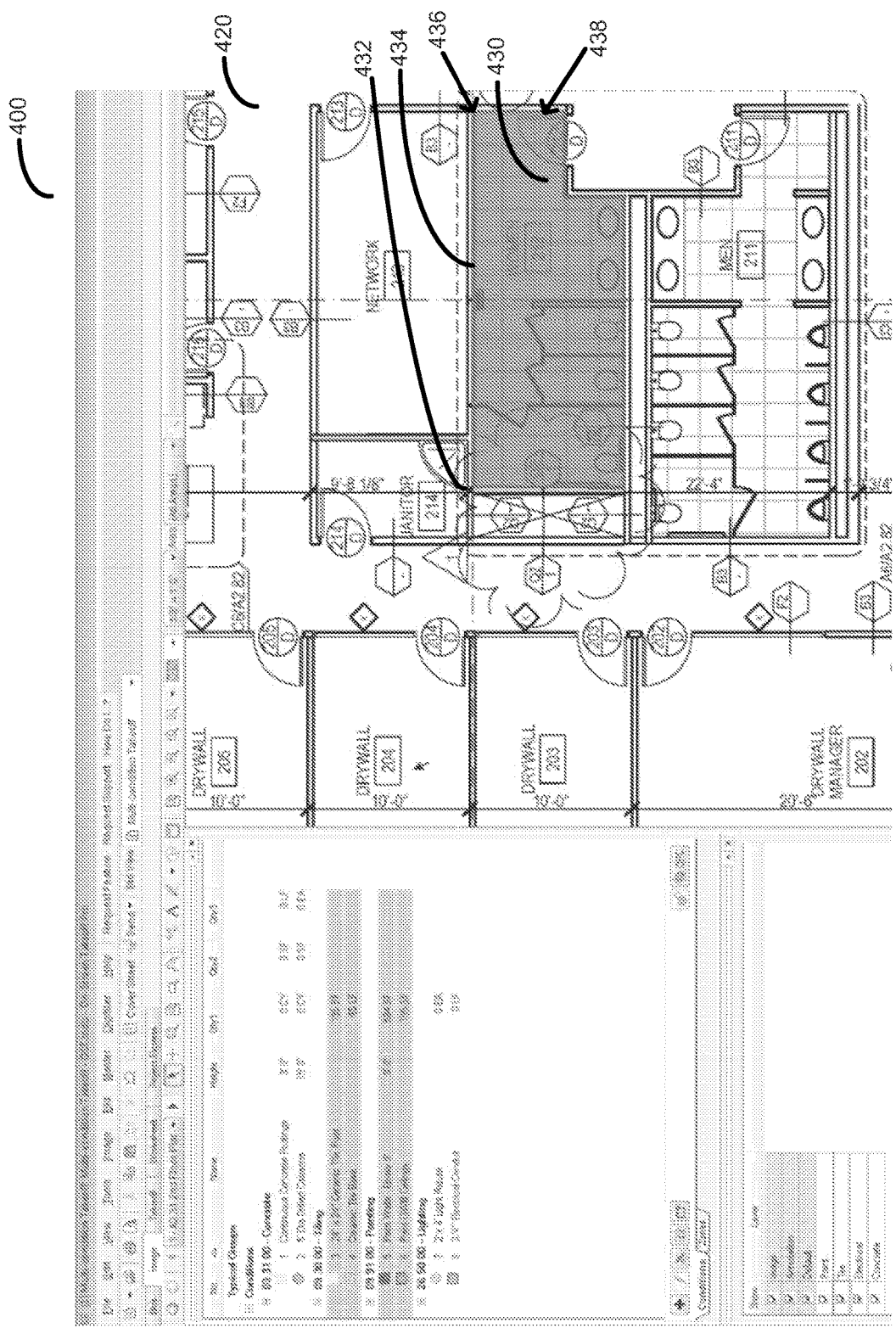

FIG. 5A illustrates a user interface screen in which four different conditions have been selected at the same time. This is done, in one embodiment, by first selecting a building condition in the conditions list 116 and then holding the control key down and clicking on additional building conditions to select them. In the screen 400 of FIG. 5A, four building conditions have been selected. These include 24"× 24" Ceramic Tile Floor, Ceramic Tile Base, Paint Walls—Epoxy 9', and Paint GWB Ceilings. Because these four building conditions cover the same surface area for a bathroom, takeoff can be performed for them at the same time. As can be seen in FIG. 5A, when the building conditions are first selected, their corresponding quantities are all zero. Once they have been selected, the user can move the computer pointer to the drawing 420 to select an area for takeoff of these building conditions. This is illustrated in FIG. 5B.

To select an area such as area 430 for takeoff of multiple building conditions, the user can click on a first corner of the area such as the corner 432. Because the software recognizes that at least one of the selected building conditions involves a linear or area unit of quantity, clicking on a spot generates a line that can be dragged to a second spot on the drawing. Once the user has dragged the line to a second corner of the area that is being selected, the user can click again to indicate that spot as a corner. This enables the user to change the direction of the line. For example, once the line 434 has been dragged to the corner 436, clicking on the corner 436 allows the user to change the direction of the line from horizontal to vertical to generate the line 438. By clicking on the corners of the selected area and changing the direction of the line, the user can select a desired area for takeoff. To complete the area, the user can drag the line back to the starting point and double click on the corner 432 to indicate that the selection has been made. Alternative embodiments for selection of an area for takeoff are also possible. For example, the user may be able to click on a corner to select a starting point for the area and then the drag the pointer to select an entire area.

Once an area has been selected, the program checks the rules database to determine how to perform the takeoff simultaneously for the multiple conditions. The rules database determines in what order objects are drawn on the drawing and also what linear object area objects snap to. The program automatically creates visual markers for each of the selected building conditions on the drawing, while at the same time calculating a quantity measurement for each of the building conditions based on the dimensions of the selected area. For example, as shown in FIG. 5B, the program can calculate that the linear length of the perimeter of area 430 is 65 LF and thus assign this quantity to the building condition Ceramic Tile Base which requires a linear quantity for Qty1. The program also automatically detects that the floor and ceiling measurements for the same area are the same. Thus, calculated quantities for the building conditions 24"×24" Ceramic Tile Floor and Paint GWB Ceiling are the same 195 SF. For paint the program recognizes that height and surface area of the walls need to be taken into account instead of the surface of the area 430 as shown in FIG. 4B. Although height is not shown in the drawing 420, it is taken into account when it is included as a property for a building condition (shown in FIG. 2 under Dimension 230). The software program of the preferred embodiment of the present invention identifies the underlying properties of each of the selected building conditions and takes those into account in both creating the visual markers on the drawing and calculating quantities for takeoff.

Figure 6:
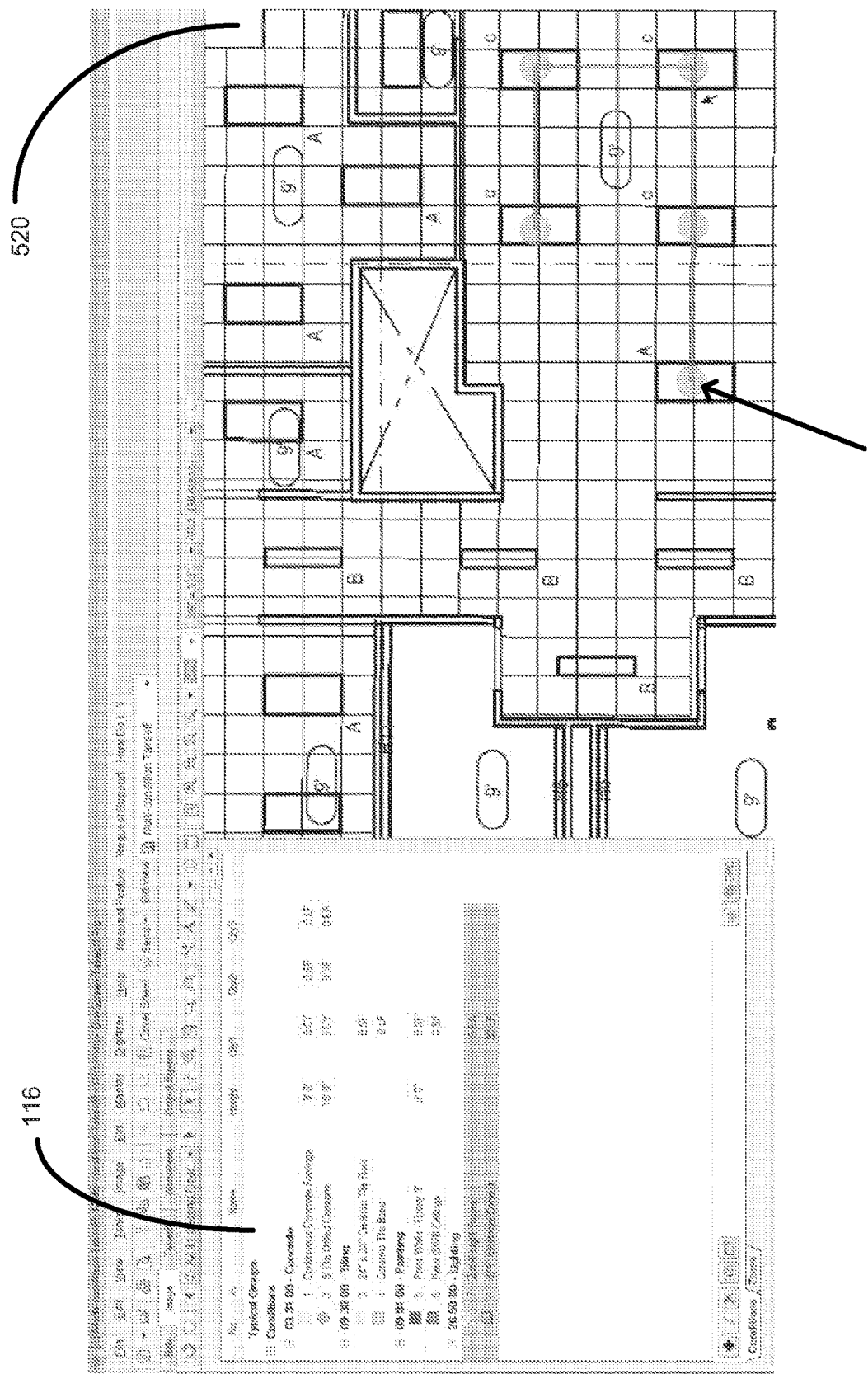
FIG. 6 is a diagram illustrating an exemplary takeoff of multiple building conditions one of which is quantified by count.

FIG. 6 illustrates a situation in which one of the selected building conditions is a type that needs to be measured by count and the other building condition should be quantified by linear feet. The building conditions selected in FIG. 6 are light fixtures and the electrical conduit connecting the light fixtures. Once the user has selected these two building conditions in the conditions list 116, the pointer can be moved to the drawing 520 for takeoff. Generally, count objects are created each time the user clicks on a spot on the drawing. Thus, to takeoff both building conditions, the user can begin by clicking on the spot 530 on the drawing 520. If takeoff included only building conditions that are quantified by count, then each click would create one object. However, because the takeoff shown in FIG. 6 includes both count and linear building conditions, clicking on the spot 530 creates one live object for the light fixture and also generates a line that can be moved across the drawing to create an object for electrical conduit. Both building conditions can be created simultaneously by clicking on spots on the drawing where a light fixture should be placed, while moving to the second count point and clicking the mouse again to generate a linear object for the electrical conduit. Alternative methods of using the pointer to create live objects are contemplated. Once the selection has been made, count and linear calculations are automatically made by the software and displayed in the conditions list 116.

This construction software program allows construction professionals to create multiple live objects on a construction drawing at the same time and simultaneously quantify multiple building conditions associated with those live objects. This system of performing multiple building condition takeoffs at the same time significantly increases efficiency of the bidding process and reduces the time required for takeoff.

As would be known to a person of ordinary skill in the art, the software program of the preferred embodiment of the present invention is generally stored in a non-transitory computer medium such as memory in a computer device and is run by a processor inside that computer. This processor can be located in a computer in an office, in a local or remote server, or in a network cloud.

It is to be understood that the above description is intended to be illustrative, and not restrictive. For example, it is understood that the term clicking and dragging are used as exemplary methods of selecting an object or an area. All other methods of selecting an object or area on a screen are contemplated, e.g., tapping, and the like. For example, the above-described embodiments may be used in combination with each other. Many other embodiments will be apparent to those of skill in the art upon reviewing the above description. The scope of the invention therefore should be determined with reference to the appended claims, along with the full scope of equivalents to which such claims are entitled. In the appended claims, the terms "including" and "in which" are used as the plain-English equivalents of the respective terms "comprising" and "wherein."

What is claimed is:

1. A computer-implemented method of generating a rules database associated with performing a takeoff with respect to a construction project, the method comprising:
    storing, based on user input received via a user interface presented via a display device, a first set of rules used to create takeoff objects on a construction drawing associated with the construction project, wherein the takeoff objects correspond to multiple building conditions that are each quantifiable as numbered-count takeoff objects, linear takeoff objects, or area takeoff objects, and wherein the first set of rules includes:
        creating, on the construction drawing, the linear takeoff objects corresponding to a first building condition of linear dimensions before creating the area takeoff objects corresponding to a second building condition of area dimensions and before creating the numbered-count takeoff objects corresponding to a third building condition of a numbered-count, and
        creating, on the construction drawing, the area takeoff objects before creating the numbered-count takeoff objects;
    storing, based on the user input, a second set of rules used to simultaneously quantify the linear dimensions of the linear takeoff objects, the area dimensions of the area takeoff objects, and the numbered count of the numbered-count takeoff objects, wherein the second set of rules include:
        automatically calculating the linear dimensions based on the numbered-count, and
        automatically calculating the area dimensions based on the linear dimensions;
    determining a set of visual properties for displaying a first visual marker, a second visual marker, and a third visual marker on the construction drawing at a same time that enables an identification of the linear takeoff objects, the area takeoff objects, and the numbered-count takeoff objects;
    displaying, based on the set of visual properties, the first visual marker using a first visual property to distinguish the linear takeoff objects from the area takeoff objects and the numbered-count takeoff objects;

displaying, based on the set of visual properties, the second visual marker using a second visual property to distinguish the area takeoff objects from the linear takeoff objects and the numbered-count takeoff objects; and displaying, based on the set of visual properties, the third visual marker using a third visual property to distinguish the numbered-count takeoff objects from the linear takeoff objects and the area takeoff objects.

2. The computer-implemented method of claim 1, wherein the second set of rules further comprises automatically calculating the linear dimensions based on a linear distance between two of the numbered-count takeoff objects.

3. The computer-implemented method of claim 1, wherein the second set of rules further comprises automatically calculating the linear dimensions without receiving user input that specifies the linear dimensions.

4. The computer-implemented method of claim 1, wherein the second set of rules further comprises automatically calculating the area dimensions based on a positioning of the area takeoff objects with respect to one of an inner edge, an outer edge, or a midline of the linear takeoff object.

5. The computer-implemented method of claim 1, wherein the second set of rules further comprises automatically calculating the area dimensions using the linear dimensions of two or more of the linear takeoff objects that bound the area takeoff object.

6. The computer-implemented method of claim 1, wherein the second set of rules further comprises automatically calculating the area dimensions without receiving user input that specifies the area dimensions.

7. The computer-implemented method of claim 1, wherein the second set of rules further comprises:

a rule that automatically calculates, using the calculated area dimensions, other area dimensions of a fourth building condition that corresponds to the second building condition.

8. A non-transitory computer-readable medium that stores software instructions that, when executed by a processor, cause the processor to:

store, based on user input received via a user interface presented via a display device, a first set of rules used to create takeoff objects on a construction drawing associated with a construction project, wherein the takeoff objects correspond to multiple building conditions that are each quantifiable as numbered-count takeoff objects, linear takeoff objects, or area takeoff objects, and wherein the first set of rules includes:

creating, on the construction drawing, the linear takeoff objects corresponding to a first building condition of linear dimensions, relative to creating the area takeoff objects corresponding to a second building condition of area dimensions, and relative to creating the numbered-count takeoff objects corresponding to a third building condition of a numbered-count, and creating, on the construction drawing, the area takeoff objects relative to creating the numbered-count takeoff objects;

store, based on the user input, a second set of rules used to simultaneously quantify the linear dimensions of the linear takeoff objects, the area dimensions of the area takeoff objects, and the numbered count of the numbered-count takeoff objects, wherein the second set of rules include:

automatically calculating the linear dimensions based on the numbered-count, and automatically calculating the area dimensions based on the linear dimensions;

determine a set of visual properties for displaying a first visual marker, a second visual marker, and a third visual marker on the construction drawing at a same time that enables an identification of the linear takeoff objects, the area takeoff objects, and the numbered-count takeoff objects;

display, based on the set of visual properties, the first visual marker using a first visual property to distinguish the linear takeoff objects from the area takeoff objects and the numbered-count takeoff objects;

display, based on the set of visual properties, the second visual marker using a second visual property to distinguish the area takeoff objects from the linear takeoff objects and the numbered-count takeoff objects; and display, based on the set of visual properties, the third visual marker using a third visual property to distinguish the numbered-count takeoff objects from the linear takeoff objects and the area takeoff objects.

9. The computer-readable medium of claim 8, wherein the second set of rules comprises automatically calculating the linear dimensions based on a linear distance between two of the numbered-count takeoff objects.

10. The computer-readable medium of claim 8, wherein the second set of rules comprises automatically calculating the linear dimensions without receiving user input that specifies the linear dimensions.

11. The computer-readable medium of claim 8, wherein the second set of rules comprises automatically calculating the area dimensions based on a positioning of the area takeoff objects with respect to one of an inner edge, an outer edge, or a midline of the linear takeoff object.

12. The computer-readable medium of claim 8, wherein the second set of rules comprises automatically calculating the area dimensions using the linear dimensions of two or more of the linear takeoff objects that bound the area takeoff object.

13. The computer-readable medium of claim 8, wherein the second set of rules comprises automatically calculating the area dimensions without receiving user input that specifies the area dimensions.

14. The computer-readable medium of claim 8, wherein the second set of rules further comprises:

a rule that automatically calculates, using the calculated area dimensions, other area dimensions of a fourth building condition that corresponds to the second building condition.

15. A network device comprising:

a memory storing software instructions; and a processor that executes the software instructions to:

store, based on user input received via a user interface presented via a display, a first set of rules used to create takeoff objects on a construction drawing associated with a construction project, wherein the takeoff objects correspond to multiple building conditions that are each quantifiable as numbered-count takeoff objects, linear takeoff objects, or area takeoff objects, and wherein the first set of rules includes:

creating, on the construction drawing, the linear takeoff objects corresponding to a first building condition of linear dimensions, relative to creating the area takeoff objects corresponding to a second building condition of area dimensions, and relative to creating the numbered-count takeoff objects corresponding to a third building condition of a numbered-count, and creating, on the construction drawing, the area takeoff objects relative to creating the numbered-count takeoff objects;
store, based on the user input, a second set of rules used to simultaneously quantify the linear dimensions of the linear takeoff objects, the area dimensions of the area takeoff objects, and the numbered count of the numbered-count takeoff objects, wherein the second set of rules include:
   automatically calculating the linear dimensions based on the numbered-count, and
   automatically calculating the area dimensions based on the linear dimensions;
determine a set of visual properties for displaying a first visual marker, a second visual marker, and a third visual marker on the construction drawing at a same time that enables an identification of the linear takeoff objects, the area takeoff objects, and the numbered-count takeoff objects;
display, based on the set of visual properties, the first visual marker using a first visual property to distinguish the linear takeoff objects from the area takeoff objects and the numbered-count takeoff objects;
display, based on the set of visual properties, the second visual marker using a second visual property to distinguish the area takeoff objects from the linear takeoff objects and the numbered-count takeoff objects; and
display, based on the set of visual properties, the third visual marker using a third visual property to distinguish the numbered-count takeoff objects from the linear takeoff objects and the area takeoff objects.

16. The network device of claim 15, wherein the second set of rules comprises automatically calculating the linear dimensions based on a linear distance between two of the numbered-count takeoff objects.

17. The network device of claim 15, wherein the second set of rules comprises automatically calculating the linear dimensions without receiving user input that specifies the linear dimensions.

18. The network device of claim 15, wherein the second set of rules comprises automatically calculating the area dimensions based on a positioning of the area takeoff objects with respect to one of an inner edge, an outer edge, or a midline of the linear takeoff object.

19. The network device of claim 15, wherein the second set of rules comprises automatically calculating the area dimensions using the linear dimensions of two or more of the linear takeoff objects that bound the area takeoff object.

20. The network device of claim 15, wherein the second set of rules comprises automatically calculating the area dimensions without receiving user input that specifies the area dimensions.

* * * * *